(12) United States Patent
Kamada et al.

(10) Patent No.: US 12,704,578 B2
(45) Date of Patent: Aug. 11, 2026

(54) MAGNETIC RESONANCE IMAGING APPARATUS AND CALIBRATION METHOD THEREOF

(71) Applicant: FUJIFILM Healthcare Corporation, Kashiwa (JP)

(72) Inventors: Yasuhiro Kamada, Chiba (JP); Kota Hamada, Chiba (JP); Hideyuki Horio, Chiba (JP); Ayaka Ikegawa, Chiba (JP)

(73) Assignee: FUJIFILM Corporation, Tokyo (JP)

( * ) Notice: Subject to any disclaimer, the term of this patent is extended or adjusted under 35 U.S.C. 154(b) by 124 days.

(21) Appl. No.: 18/660,508

(22) Filed: May 10, 2024

(65) Prior Publication Data

US 2024/0410967 A1 Dec. 12, 2024

(30) Foreign Application Priority Data

Jun. 9, 2023 (JP) ................................ 2023-095900

(51) Int. Cl.
*G01R 33/58* (2006.01)

(52) U.S. Cl.
CPC .................................. *G01R 33/58* (2013.01)

(58) Field of Classification Search
CPC .. G01R 33/58; G01R 33/56572; G01R 33/48; G01R 35/005
See application file for complete search history.

(56) References Cited

U.S. PATENT DOCUMENTS

2013/0307541 A1* 11/2013 Paul ...................... G01R 33/58 324/318

FOREIGN PATENT DOCUMENTS

JP 2015-119866 A 7/2015
JP 2017-153573 A 9/2017

* cited by examiner

*Primary Examiner* — G.M. A Hyder
(74) *Attorney, Agent, or Firm* — Paul Teng

(57) ABSTRACT

An apparatus and a method can be provided to improve the accuracy of automatic calibration without extension of an examination time in an MR examination. A range of calibration performed before main imaging is determined with reference to a main imaging range and other spatial information. The spatial information consists of information for estimating an MR signal generation range, such as a subject region, a uniform magnetic field region, and a structural restriction of an apparatus, and a calibration range is determined such that a proportion of the MR signal generation range included in the calibration range is as high as possible.

18 Claims, 11 Drawing Sheets

Start
POSITIONING IMAGING
S1
n = 1
SET POSITION OF MAIN IMAGING (n)
S2
DETERMINE MAIN IMAGING RANGE
S3
SPATIAL INFORMATION
SET CALIBRATION RANGE
S4
CALIBRATION
S5
EXECUTE MAIN IMAGING (n)
S6
n = n + 1
1 < n < N?
No
Yes
DETERMINE MAIN IMAGING POSITION/RANGE
S7
IS RE-CALIBRATION REQUIRED?
S8
Yes
No
EXECUTE MAIN IMAGING (n)
S9
End

MAGNETIC RESONANCE IMAGING APPARATUS AND CALIBRATION METHOD THEREOF

CROSS-REFERENCE TO RELATED APPLICATION

The present application claims priority from Japanese Patent Application No. 2023-095900 filed on Jun. 9, 2023, the content of which is hereby incorporated by reference into this application.

BACKGROUND OF THE INVENTION

1. Field of the Invention

The present invention relates to a magnetic resonance imaging apparatus (hereinafter, referred to as an MRI apparatus), and particularly, to a calibration technique performed before imaging using the MRI apparatus.

2. Description of the Related Art

The MRI apparatus applies a high-frequency magnetic field to a subject in an imaging space in which a uniform static magnetic field is generated, acquires a nuclear magnetic resonance signal generated from the subject, and images the nuclear magnetic resonance signal. In order to obtain a high image quality with the MRI apparatus, it is important that the uniformity of the static magnetic field, the high-frequency magnetic field to be applied, and a reception sensitivity distribution for receiving the nuclear magnetic resonance signal is high, but these include various errors due to factors on a subject or apparatus side. Therefore, in the MRI apparatus in the related art, a large number of times of calibration imaging are performed before the imaging, and various errors are reduced. The calibration items include an appearance of the subject, a transmission gain, a reception gain, a center frequency, and the like, in addition to the above-described static magnetic field distribution (B0 distribution), transmission sensitivity distribution (B1 distribution), and reception sensitivity distribution.

Calibration imaging is performed prior to main imaging, and a result of the calibration imaging is used for imaging conditions of the main imaging or image reconstruction after the imaging, to obtain an image with the reduced error. For example, JP2017-153573A discloses that phases of a transmission magnetic field and a static magnetic field are obtained as calibration data, to correct a B0 map or a B1 map in main imaging. In addition, JP2015-119866A discloses that a reception sensitivity distribution is acquired by calibration imaging and is used for image reconstruction of main imaging.

In the related art, after an imaging position of the main imaging (main imaging range) is determined, the calibration imaging is automatically performed with reference to the main imaging range. For example, JP2015-119866A (FIG. 5) describes that a region having a width larger than that of the subject including an oblique imaging cross section including an examination part is set as a calibration range.

SUMMARY OF THE INVENTION

However, the accuracy of the calibration may be reduced depending on the disposition of the subject or the like, which may lead to image quality degradation. For example, in a case in which a location away from the left and right centers of the subject is the examination part, for example, in a case of the left or right shoulder or the limbs, the main imaging range is a predetermined range with the examination part as the center in a state in which the examination part is positioned at the center of the static magnetic field. In a case in which the calibration range is set to include the main imaging range, there is a possibility that a subject region also exists at a position deviating from the calibration range. Since the calibration result is not reflected in the subject that exists outside the calibration range, in a case in which the imaging range is changed in the next main imaging and the region outside the calibration range is included in the main imaging range, there is a risk that an image in which the error is not correctly corrected is obtained. Specifically, outside the calibration range of the reception coil sensitivity distribution, the sensitivity distribution data is not correctly created, and thus the signal cannot be reconstructed. In addition, outside the calibration range of the static magnetic field distribution, the shimming calculation data is not correctly created, and thus the fat signal cannot be suppressed.

In order to prevent the image quality degradation, in a case in which the automatic calibration is re-executed or the calibration imaging is performed by expanding the calibration range to include the entire width of the subject as disclosed in JP2015-119866A, an imaging time is lengthened and an examination time is extended.

An object of the present invention is to improve the accuracy of the automatic calibration without extension of the examination time.

In the present invention, calibration imaging conditions are optimized with reference to spatial information on each element constituting the apparatus or the subject in addition to the main imaging range. As a result, redundant calibration is avoided, and the accuracy of the automatic calibration is improved.

An aspect of the present invention relates to an MRI apparatus comprising: an imaging unit that performs main imaging of collecting a nuclear magnetic resonance signal, which is generated from a subject placed in a static magnetic field space, to acquire an image of the subject, and calibration imaging of collecting calibration data required for the main imaging; and a controller that controls an operation of the imaging unit, in which the controller includes a calibration range setting unit that sets a range of the calibration imaging. The calibration range setting unit sets a calibration range by using a main imaging range set in advance and spatial information other than the main imaging range.

Another aspect of the present invention relates to a calibration method of collecting, before main imaging of acquiring an image of a subject, calibration data required for the main imaging, the calibration method comprising: a step of setting a calibration range. In the step of setting the calibration range, the calibration range is set by combining a main imaging range set in advance and spatial information other than the main imaging range.

According to the present invention, the calibration is executed by setting the calibration range for target items of the calibration in consideration of the spatial conditions of the apparatus, the elements of the apparatus, or the subject, and thus a calibration result in an originally required space can be efficiently obtained. As a result, waste that leads to the extension of the examination time, such as re-execution of the calibration or setting of a too wide range, can be eliminated, and a calibration result with high accuracy can be obtained. As a result, an image having a good image quality can be acquired in a short examination time.

DESCRIPTION OF THE PREFERRED EMBODIMENTS

Hereinafter, embodiments of the present invention will be described.

An MRI apparatus according to the embodiment of the present invention includes, in a broad sense, an imaging unit that generates a nuclear magnetic resonance in a subject disposed in a static magnetic field space and collects a nuclear magnetic resonance signal (hereinafter, referred to as an MR signal) generated from the subject to acquire an image of the subject, and a controller that controls an operation of the imaging unit. The imaging performed by the imaging unit includes imaging for acquiring the image of the subject (hereinafter, referred to as main imaging), and calibration imaging for collecting calibration data used in the main imaging. The controller controls the operation of the imaging unit, including such calibration imaging.

Figure 1:
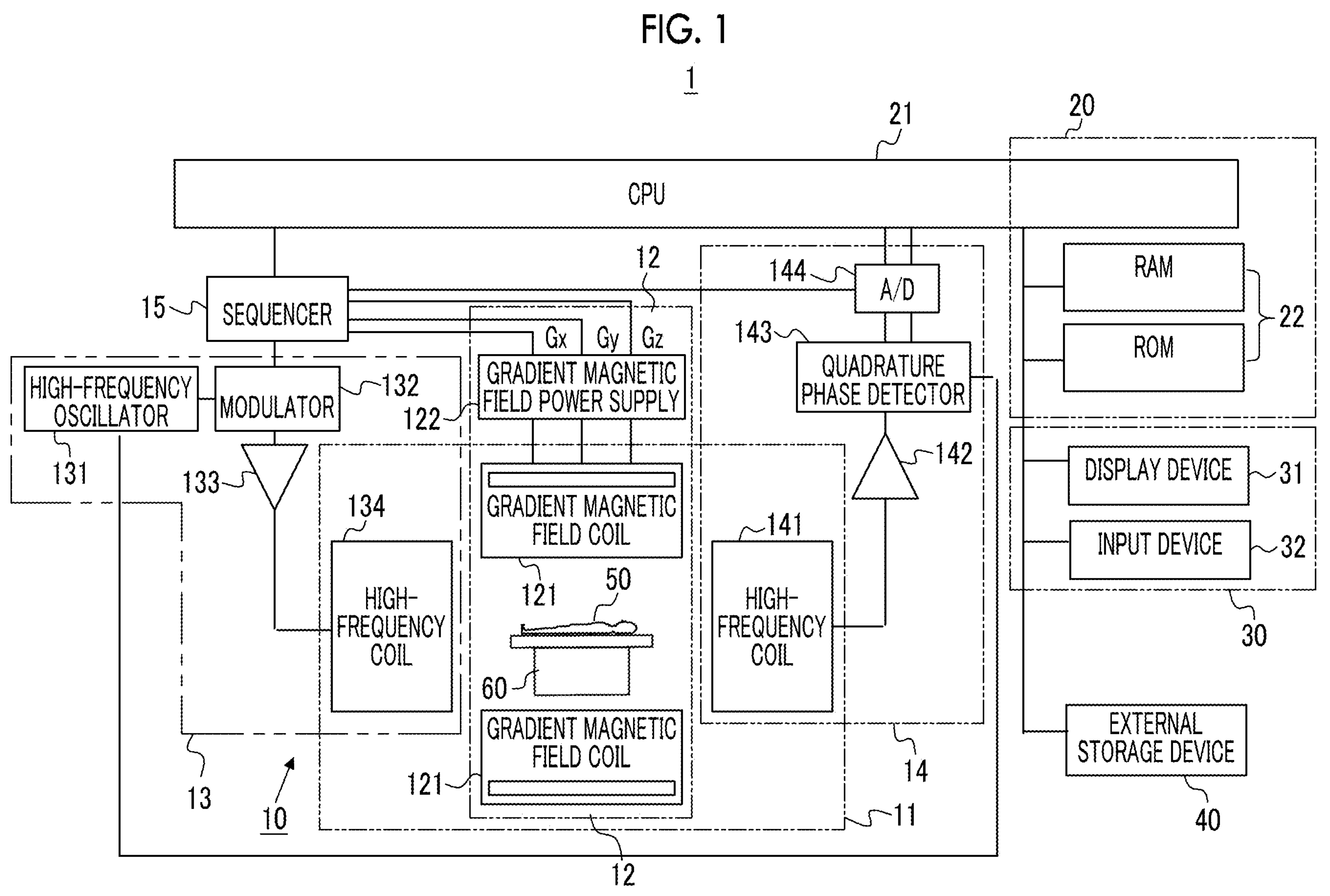
FIG. 1 is a diagram illustrating an overall outline of an MRI apparatus to which the present invention is applied.

In the MRI apparatus according to the embodiment of the present invention, a configuration of the apparatus other than the function related to the calibration is the same as that of an MRI apparatus in the related art. Hereinafter, the outline of the apparatus will be described. FIG. 1 illustrates an example of the MRI apparatus to which the present invention is applied.

As illustrated in FIG. 1, the MRI apparatus 1 comprises an imaging unit 10 including a static magnetic field generation system 11, a gradient magnetic field generation system 12, a transmission system 13, a reception system 14, and a sequencer 15, a controller 20 including a CPU 21, and a UI unit 30. The static magnetic field generation system 11 consists of a superconducting magnet, a normal electric magnet, a magnet that generates a static magnetic field, such as a permanent magnet, or the like (not illustrated), and provides a static magnetic field space (imaging space) in which a subject 50 is placed. The subject 50 is inserted into the static magnetic field space in a state of being placed on an examination table 60. There is a horizontal magnetic field type or a vertical magnetic field type MRI apparatus depending on a direction of the generated static magnetic field. The present invention can be applied to any type of MRI apparatus.

The gradient magnetic field generation system 12 provides a gradient in a three-axis direction to the static magnetic field generated by the static magnetic field generation system 11, and comprises three-axis direction gradient magnetic field coils 121 and gradient magnetic field power supplies 122. The transmission system 13 comprises a high-frequency oscillator 131, a modulator 132, a high-frequency amplifier 133, and a high-frequency coil 134, and applies a pulse-like high-frequency magnetic field to the subject 50. The reception system 14 comprises a high-frequency coil 141 that receives the MR signal generated from the subject 50, an amplifier 142, a quadrature phase detector 143, and an A/D converter 144. The sequencer 15 operates the gradient magnetic field generation system 12, the transmission system 13, and the reception system 14 in accordance with a predetermined pulse sequence. The operation of each element of the imaging unit 10 is the same as that of a general MRI apparatus, and thus the detailed description thereof will be omitted.

The controller 20 controls the entire operation of the imaging unit 10, and performs image reconstruction using the MR signal or various operations using the reconstructed image. The controller 20 can be configured by a computer comprising a memory (ROM, RAM) 22 or a CPU 21. A part of the functions performed by the controller 20 may be realized by a programmable IC such as an ASIC or an FPGA, or may be realized by a processing apparatus different from the MRI apparatus. The UI unit 30 comprising a display device 31 that displays an image as a processing result, a GUI for interacting with a user, or the like, and an input device 32 such as a mouse, a trackball, or a keyboard is connected to the controller 20. An external storage device 40 may be connected to the controller (computer) 20.

Figure 2:
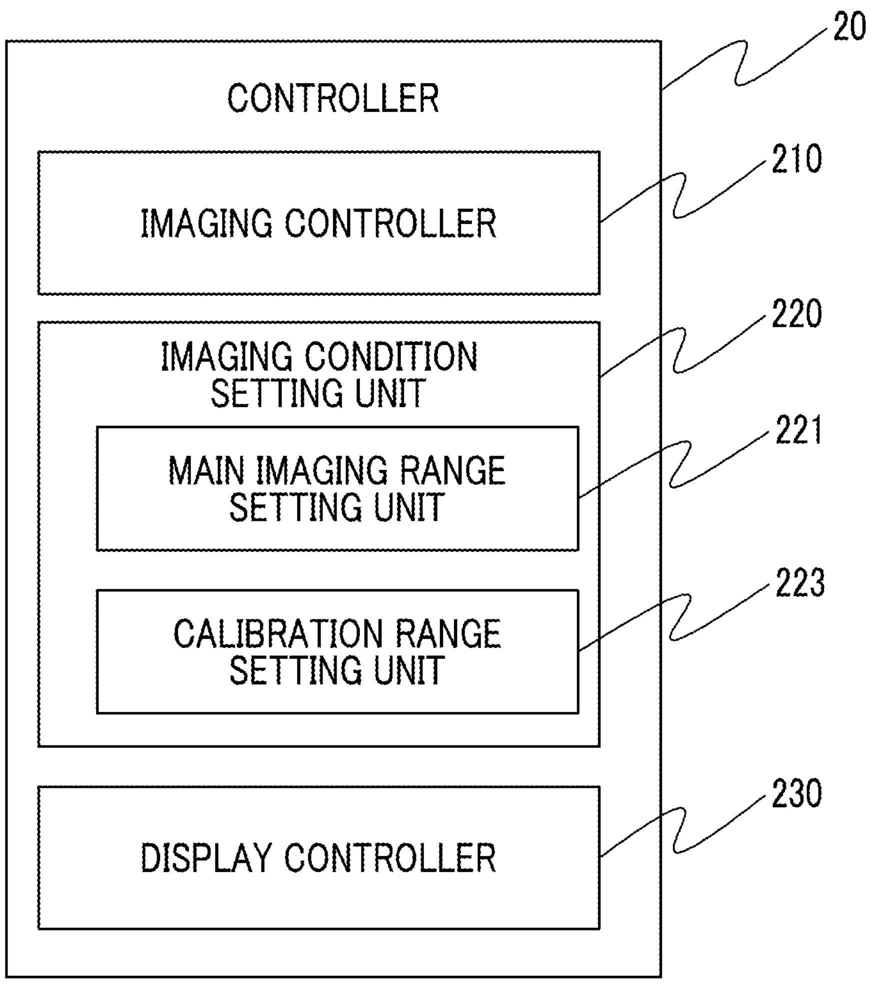
FIG. 2 is a functional block diagram of a controller of the MRI apparatus according to an embodiment.

FIG. 2 illustrates an example of a functional block diagram of the controller 20. As illustrated in FIG. 2, the controller 20 includes an imaging controller 210, an imaging condition setting unit 220, and a display controller 230 that control the imaging unit 10 via the sequencer 15. The imaging condition setting unit 220 has a function of setting conditions for the calibration imaging, in addition to a function of setting conditions for the main imaging (main imaging range setting unit 221), and includes, for example, a calibration range setting unit 223. The calibration range setting unit 223 determines an appropriate calibration range with reference to the main imaging range determined based on the disposition of the subject in the main imaging, along with other spatial information, specifically, spatial information on the subject, magnetic field distribution information formed by the static magnetic field generation system 11 or the gradient magnetic field generation system 12, and positional information on the high-frequency coils 134 and 141 for transmission and reception, and sets the determined calibration range as the condition for the calibration imaging performed by the imaging unit 10.

The spatial information other than the main imaging range referred to by the calibration range setting unit 223 is information on an image (including a scanogram) obtained by pre-imaging the subject, examination conditions such as an examination part, information owned as the specification of the apparatus, information on the magnetic field obtained by a simulation, and the like. The calibration range set by the calibration range setting unit 223 may be set to be different depending on the target item of the calibration, or may be set as a range common to each item. The setting of the specific calibration range will be described in detail in the following embodiments.

Hereinafter, a flow of an MRI examination including the calibration imaging will be described with reference to FIG. 3. In a general examination flow, a plurality of types of imaging (N times of imaging) are performed, and thus the description is made on the premise of this flow.

First, in order to determine the imaging position, positioning imaging of scanning the entire body of the subject is performed (S1), and the imaging position of the first main imaging is set (S2). The setting can be performed by the user, for example, via the UI unit 30. In a case in which the position of the main imaging is set, the main imaging range setting unit 221 determines the main imaging range based on the imaging conditions, such as FOV (S3). In the related art, a predetermined calibration range determined based on the main imaging range has been set to execute the automatic calibration imaging. However, in the MRI apparatus 1 according to the present embodiment, the calibration range setting unit 223 incorporates the spatial information other than the main imaging range as the spatial information required for setting the calibration range, and sets the calibration range by using the main imaging range and the incorporated spatial information (S4).

After the calibration range is set, the imaging unit 10 executes the calibration imaging under the control of the imaging controller 210 (S5). The contents of the calibration imaging vary depending on the calibration items, such as the static magnetic field distribution, and the transmission/reception sensitivity distribution, but usually, a high-speed sequence such as FSE or FGR is used. There is also a case in which a plurality of items are acquired in one calibration imaging.

Then, the main imaging is executed by reflecting the calibration result (S6). A method of reflecting the calibration result varies depending on the item, but for example, in a case in which the B1 distribution, the reception sensitivity distribution, or the like is obtained as the calibration data, the collected MR signal or the reconstructed image is corrected by using the B1 distribution, the reception sensitivity distribution, or the like. In a case in which the B0 distribution, the transmission gain, the reception gain, the center frequency, or the like is obtained as the calibration data, the imaging is performed by adjusting these values during the imaging.

In a case of the second or subsequent imaging, after the main imaging range is determined (S7), in a case in which it is not required to change the calibration range (S8), the main imaging is performed as it is (S9). In a case in which any one of the main imaging range or the other spatial information is changed and the change of the calibration range is required, the processing returns to S4, the calibration range is set again to perform the calibration imaging again (S5), and the main imaging is performed (S6). The above-described steps are repeated until the main imaging is terminated a predetermined number of times (N times). It should be noted that, depending on the spatial information referred to in S4, the calibration range first set can be reused in the subsequent main imaging, and in this case, S8 is not required.

According to the present embodiment, by referring to, as the spatial information required for determining the calibration range, the main imaging range along with the spatial information on the subject other than the main imaging range or the apparatus side, such as the spatial constraint on the apparatus side or the magnetic field distribution generated by the apparatus, it is possible to efficiently acquire the calibration data required and sufficient for the improvement of the image quality, it is possible to reduce the time required for the calibration imaging, and it is possible to achieve both the efficiency of the examination and the improvement of the image quality. By setting an appropriate calibration range, the re-execution of the calibration can be reduced, and the extension of the examination time can be prevented.

Hereinafter, a specific embodiment of the setting of the calibration range will be described, but these embodiments are basically characterized in that a signal fill rate in the calibration range is maximized.

Figure 4:
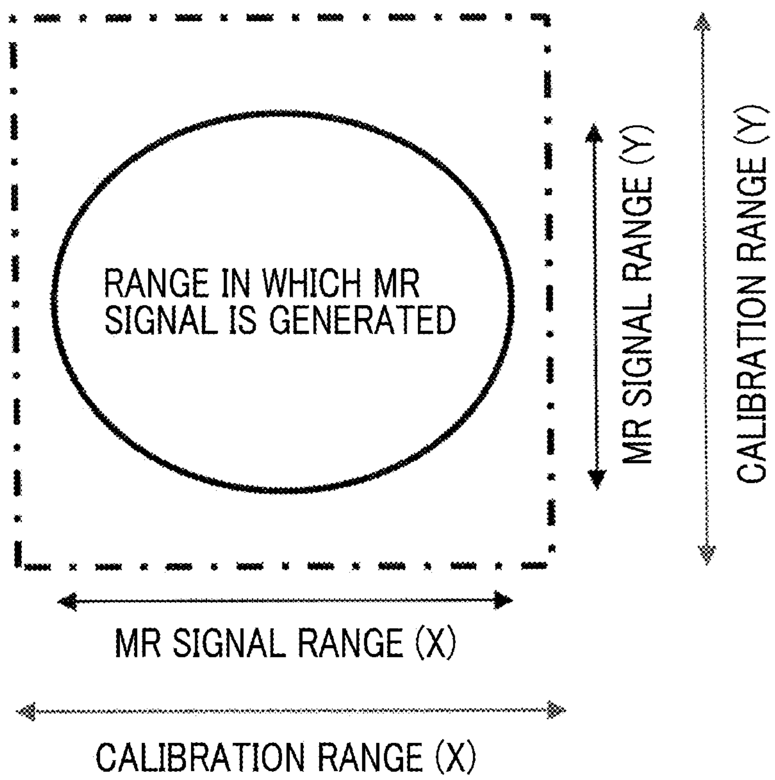
FIG. 4 is a diagram illustrating a signal fill rate in a calibration range.

As illustrated in FIG. 4, the signal fill rate is a proportion in which the calibration range covers a range in which the MR signal is generated (signal generation range) and/or a range in which the MR signal can be received (both ranges are referred to as an MR signal range).

In a case in which the signal fill rate R is defined in three dimensions, the signal fill rate R can be represented by, for example, the following expression.

$$R = MR\ \text{signal range}\ (X)/\text{calibration range}\ (X) \times MR\ \text{signal range}\ (Y)/\text{calibration range}\ (Y) \times MR\ \text{signal range}\ (Z)/\text{calibration range}\ (Z)$$

It should be noted that, in a case in which it is difficult to estimate the MR signal range in all directions, the calculation may be performed by using only a range in a specific direction in a simple manner. For example, the following expression is used. R=MR signal range (X)/calibration range (X)

Based on the premise that the calibration range covers the MR signal range, it is desirable that the MR signal range is smaller than the calibration range.

The calibration range setting unit 223 refers to the spatial information to decide the MR signal range (estimation function of the signal generation range). Specific examples of the spatial information used for the estimation of the MR signal range include a subject region, a uniform magnetic field region of the static magnetic field, a restricted region due to a structure such as an examination table or a gantry, a gradient magnetic field range, and a transmission and reception sensitivity range. In the subject region, an image having a low spatial resolution may be captured by the ultra-high-speed imaging sequence to roughly decide the region, or a positioning image may be used. The uniform magnetic field region can be obtained from the output of the magnetic field lines measured at the time of designing a static magnetic field magnet. The estimation may be performed by a separate simulation. For the examination table or the gantry, a position in the apparatus coordinates (imaging space coordinates) can be decided as the region in which the MR signal is not generated from the three-dimensional design data. The gradient magnetic field range and the transmission sensitivity range can be obtained by a simulation. The reception sensitivity distribution can be obtained by associating the sensitivity distribution of the reception coil itself calculated by a simulation or the like and the image (camera image or MR image) of the reception coil worn by the subject with the apparatus coordinates.

The calibration range setting unit 223 sets the calibration range such that the signal fill rate estimated from the spatial information is as high as possible. By increasing the signal fill rate, it is possible to exclude a range that does not affect the image quality as much as possible, and it is possible to achieve both the efficiency of the calibration, that is, the reduction of the time related to the calibration imaging, and the improvement of the image quality. Hereinafter, a specific embodiment for increasing the signal fill rate will be described.

Figure 3:
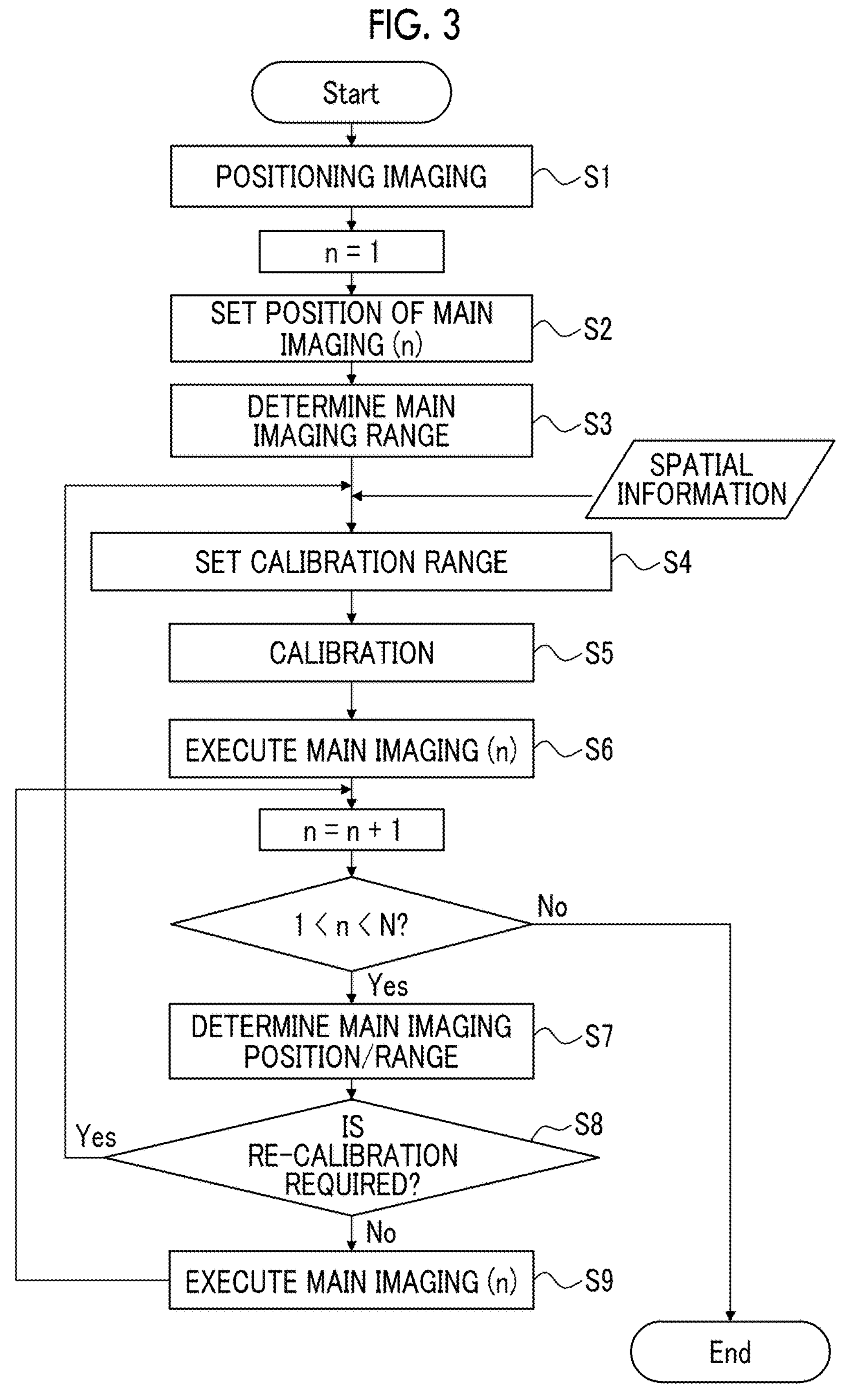
FIG. 3 is a diagram illustrating a flow of calibration processing according to the embodiment.

In the following embodiments, since the configuration of the controller illustrated in FIG. 2 and the flow illustrated in FIG. 3 are common, the reference numerals of these drawings are appropriately referred to.

Embodiment 1

In the present embodiment, the calibration range is set with reference to the subject position as the spatial information other than the main imaging range.

Figure 5:
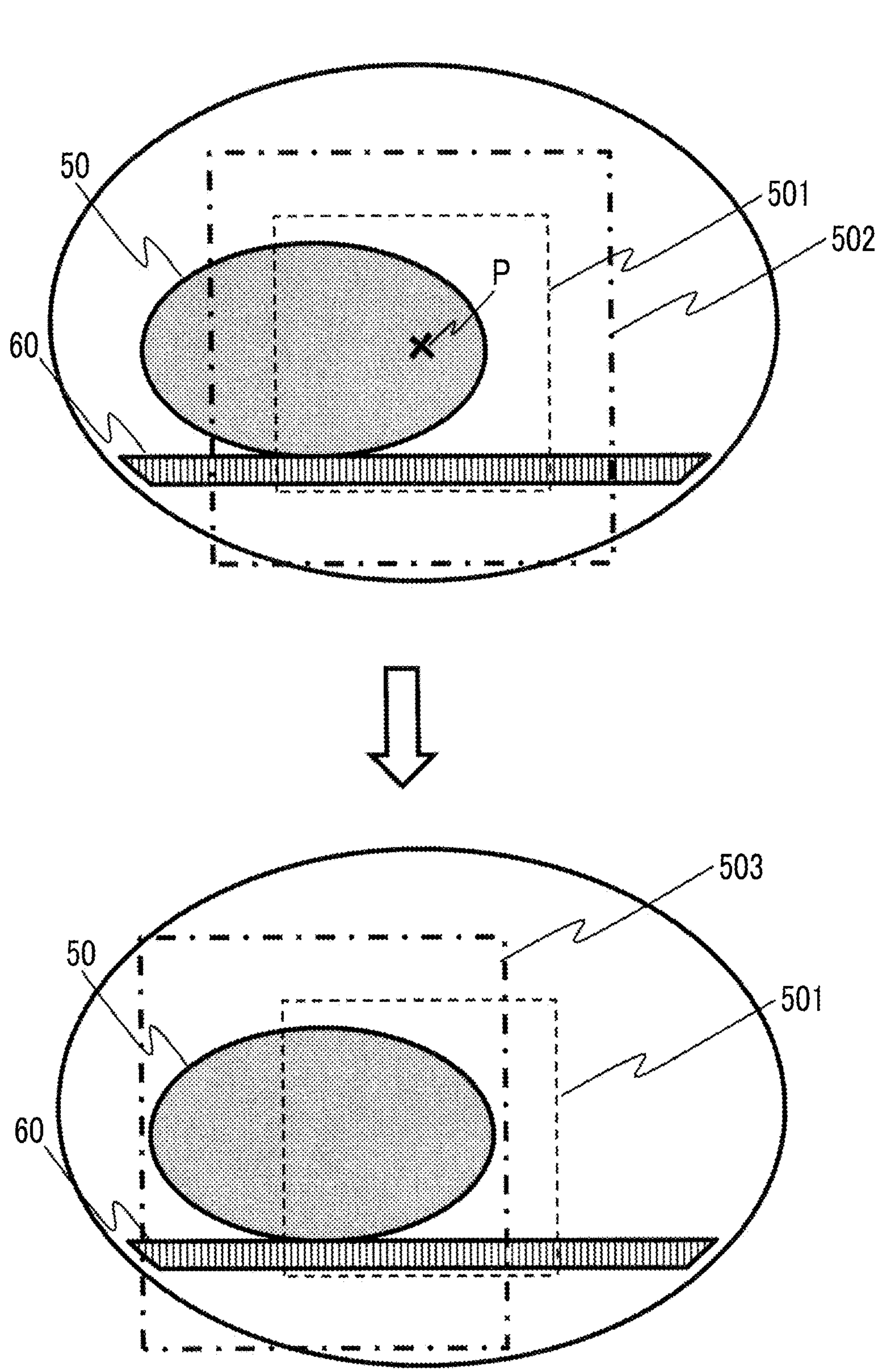
FIG. 5 is a diagram illustrating a setting of a calibration range according to Embodiment 1.

As an example, a case in which an imaging part deviates from the center in the left-right direction of the subject is illustrated in FIG. 5. In FIG. 5, the gantry illustrated by the outermost ellipse is the imaging space (hereinafter, the same is applied). The main imaging range setting unit 221 sets a main imaging range 501 such that the imaging part P designated by the user based on the positioning image (scanogram) is located at the center. As illustrated in the upper figure of FIG. 5, in a case in which the imaging part P is disposed substantially at the magnetic field center, the imaging part P is set in a predetermined range (for example, a three-dimensional region) with the imaging part P as a center. In this case, the subject 50 is disposed at a position biased to a left side of the center of the examination table 60.

As illustrated in the upper side of FIG. 5, in a case in which a calibration range 502 is set to cover the main imaging range 501, a part of the subject may deviate from the calibration range. On the other hand, many portions in the calibration range 502 are regions in which the MR signal is not generated (outside the MR signal range).

The calibration range setting unit 223 acquires the subject position from the scanogram, and sets the calibration range 503 to match with a width of the subject in the left-right direction as illustrated on the lower side of FIG. 5. By setting the calibration range 503 in this way, the signal fill rate can be increased, and the required calibration data can be efficiently acquired. In the calibration range 503, a region in which the subject 50 does not exist in the main imaging range 501 is excluded, but this region is a region in which the MR signal is not generated, and is a region that does not require correction using the calibration data and does not require acquisition of the calibration data.

According to the present embodiment, since the positional information on the subject is used as the spatial information for determining the calibration range, even in a case in which the disposition of the subject is biased with respect to the magnetic field center, the calibration data can be reliably acquired for the region in which the data leakage may occur in a range based on the main imaging range, and the acquisition of the calibration data, which is not required, can be reduced. As a result, it is possible to enhance the effectiveness of the image quality improvement using the calibration data and to suppress the extension of the examination time.

Modification Example 1 of Embodiment 1

In Embodiment 1, the positional information on the subject is used as the spatial information other than the main imaging range, but it is possible to further add another spatial information to set the calibration range. As the other spatial information, for example, spatial information on the magnetic field uniformity (static magnetic field map) or information on the space in which the MR signal is not generated due to the apparatus restriction is used.

The static magnetic field map may store data (information owned as the specification of the apparatus) obtained by measuring the static magnetic field distribution of the apparatus in advance in the external storage device 40 or the like, and the calibration range setting unit 223 may read the data and use the data, or information obtained by another calibration imaging may be available. The information on the space in which the MR signal is not generated is, for example, positional information on the examination table on which the subject is placed, positional information on a fixture or a restraining tool worn by the subject, and the like.

Figure 6:
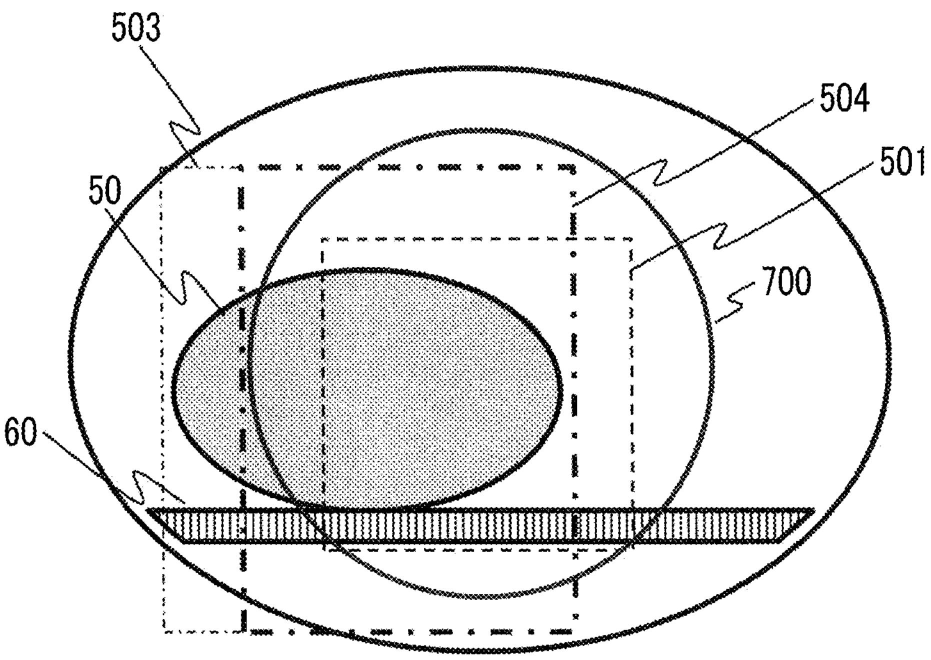
FIG. 6 is a diagram illustrating a setting of a calibration range according to Modification Example 1 of Embodiment 1.

FIG. 6 illustrates a case in which the calibration range is set by using the static magnetic field distribution in the horizontal magnetic field type MRI apparatus. In FIG. 5, the calibration range 503 is set to cover the left and right widths of the subject disposed to deviate from the magnetic field center, but in the present modification example, the information on the region that is determined as a uniform magnetic field region 700 from the static magnetic field measurement data is referred to, and the region that deviates from the uniform magnetic field region 700 (inside of a region indicated by a circle in FIG. 6) is excluded from the calibration range 503 of FIG. 5 to set a calibration range 504. In the region deviating from the uniform magnetic field region 700, the MR signal is not generated under the same conditions as those in the uniform magnetic field region 700, and thus the signal fill rate can be further increased by excluding this region.

Modification Example 2 of Embodiment 1

Figure 7:
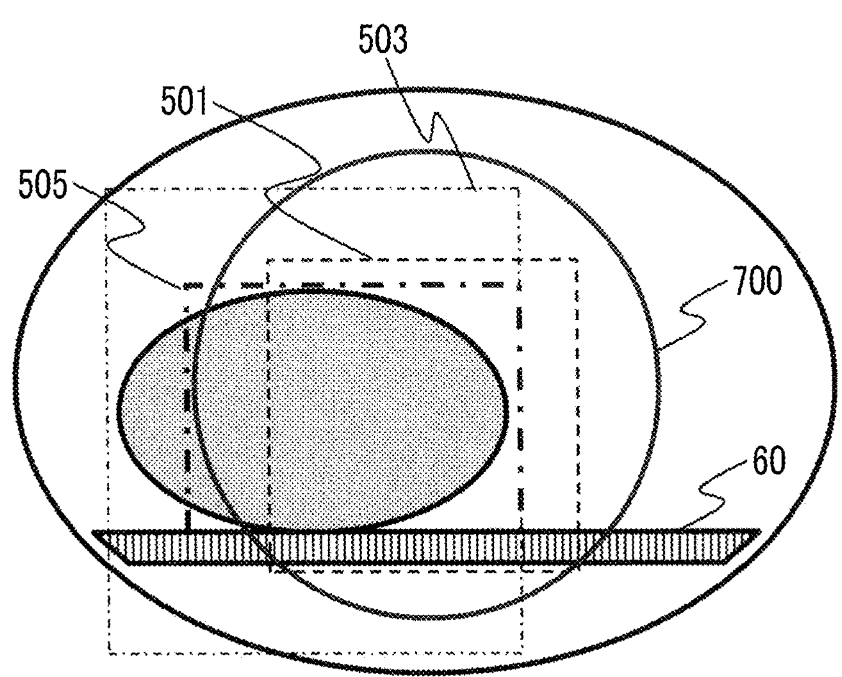
FIG. 7 is a diagram illustrating a setting of a calibration range according to Modification Example 2 of Embodiment 1.

The present modification example is a modification example in which the calibration range 503 is further narrowed for the subject in the up-down direction to increase the signal fill rate, and a calibration range 505 is determined with reference to the positional information on the subject in the up-down direction and the positional information on the examination table as illustrated in FIG. 7. The positional information on the subject in the up-down direction can be acquired from a pre-measurement image such as the scanogram, as in Embodiment 1. The information on the examination table can be acquired from geometrical information on the examination table held by the apparatus side and drive information on the examination table.

The calibration range setting unit 223 uses the spatial information and the information on the uniform magnetic field region 700, which is the same as that in FIG. 6, to exclude the region above the subject 50 region and the region in which the examination table 60 exists from the calibration range 503 in FIG. 5, and to exclude the uniform magnetic field region 700 to determine the calibration range 505. As a result, the signal fill rate can be further improved.

Other Modification Examples

In Modification Examples 1 and 2, it has been described that the information on the uniform magnetic field region is used as the spatial information on the magnetic field, but information on a region in which the transmission sensitivity distribution is uniform or information on a region in which the primary gradient magnetic field is obtained may be further used, and a region other than the MR signal range may be excluded by using these types of information. In addition to the information on the examination table, information on the gantry that accommodates the static magnetic field generating magnet and provides the imaging space may be used as the spatial information on the apparatus. That is, in a case in which the calibration range includes the gantry (structure), the calibration range is outside the MR signal range and is excluded.

In addition, FIGS. 6 and 7 are examples of the setting of the calibration range in which the modification is made based on the calibration range 503 illustrated in FIG. 5, but the spatial information to be referred to in addition to the subject region may be a combination of a plurality of types of spatial information or may be alone. Although not a modification example of Embodiment 1, an embodiment in which the calibration range is set by using the information on the main imaging range and the spatial information other than the subject region is also included in the present invention.

In Embodiment 1 and the modification example thereof, the horizontal magnetic field type MRI apparatus in which the subject is placed on a tunnel-shaped imaging space has been described as an example, but the calibration range can also be set in the same manner for the vertical magnetic field type MRI apparatus generates the static magnetic field in a direction orthogonal to a body axis of the subject.

Figure 8:
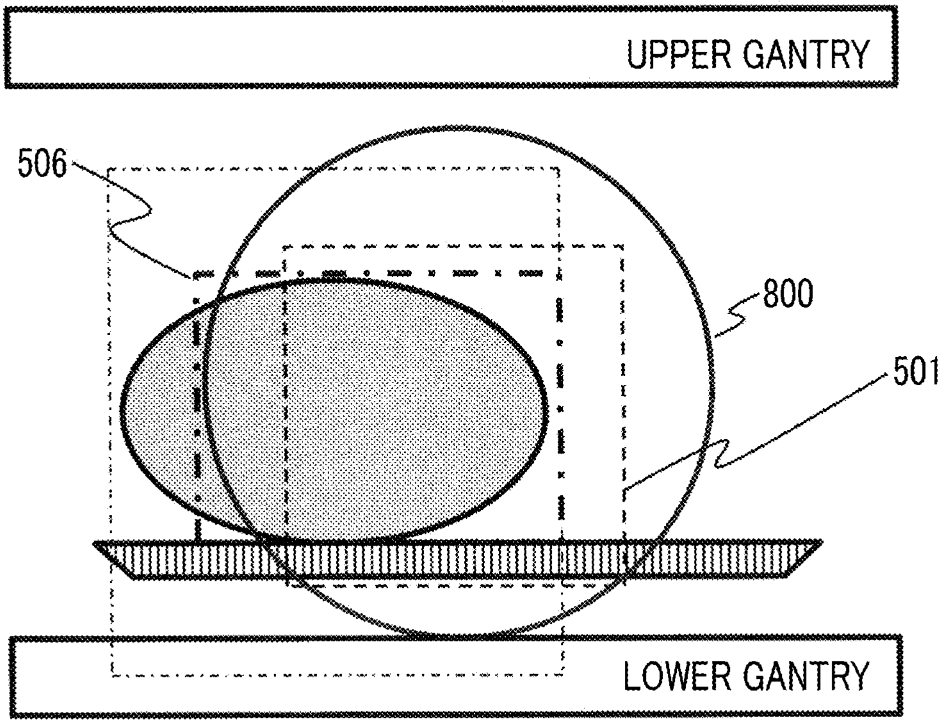
FIG. 8 is a diagram illustrating a setting of a calibration range in a vertical magnetic field type MRI apparatus.

FIG. 8 illustrates an outline of the vertical magnetic field type MRI apparatus. The vertical magnetic field type MRI apparatus has a structure in which the magnets are disposed up and down in the vertical direction across the imaging space, and the static magnetic field is generated in the up-down direction. In this MRI apparatus, the imaging is performed by placing the subject 50 lying on the examination table 60 between an upper gantry and a lower gantry that accommodate the upper and lower magnets, respectively. Even in the vertical magnetic field type, a uniform magnetic field region 800 (inside the region illustrated by a circle in FIG. 8) is a spherical region having a predetermined radius from the center of the imaging space, and a region deviating from the uniform magnetic field region 800 does not generate the MR signal. Therefore, even in a case in which the subject region exists in a region deviating from the uniform magnetic field region 800, the calibration range 506 is set by excluding this portion from the calibration range. The region of the main imaging range 501 in which the subject 50 does not exist is excluded from the calibration range 506, which is the same as in Embodiment 1. Even in the vertical magnetic field type as described above, the calibration imaging with a high signal fill rate and high efficiency can be realized in the same manner as in the horizontal magnetic field type.

Embodiment 2

The present embodiment is applied in a case in which the imaging ranges are different in a plurality of times of main imaging included in the MR examination. In the MR examination, for example, in hip joint imaging or the like, it is not uncommon to perform local imaging and imaging over a wider range in the same examination. In the present embodiment, the calibration range that can be applied to the plurality of times of main imaging is set by using subject information (information on the imaging part) in the plurality of times of main imaging. It should be noted that the plurality of times of main imaging having different imaging ranges are included in the examination flow can be understood from the data of the examination flow or the imaging conditions (imaging part), and these pieces of information can be acquired as prior information to perform the processing according to the present embodiment.

Figure 9:
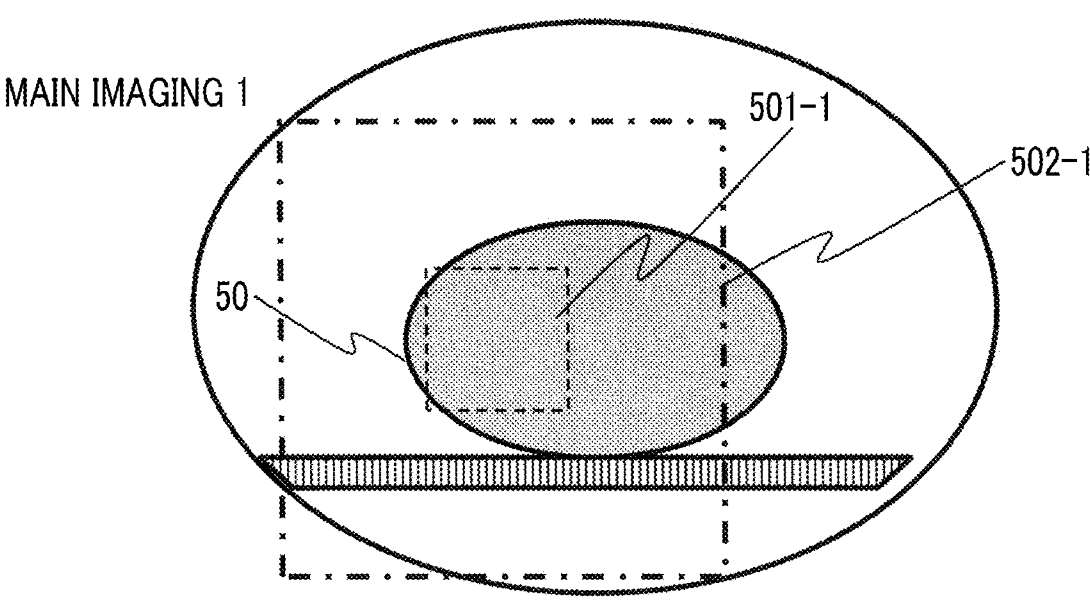
FIG. 9 is a diagram illustrating a setting of a calibration range according to Embodiment 2.
Figure 9:
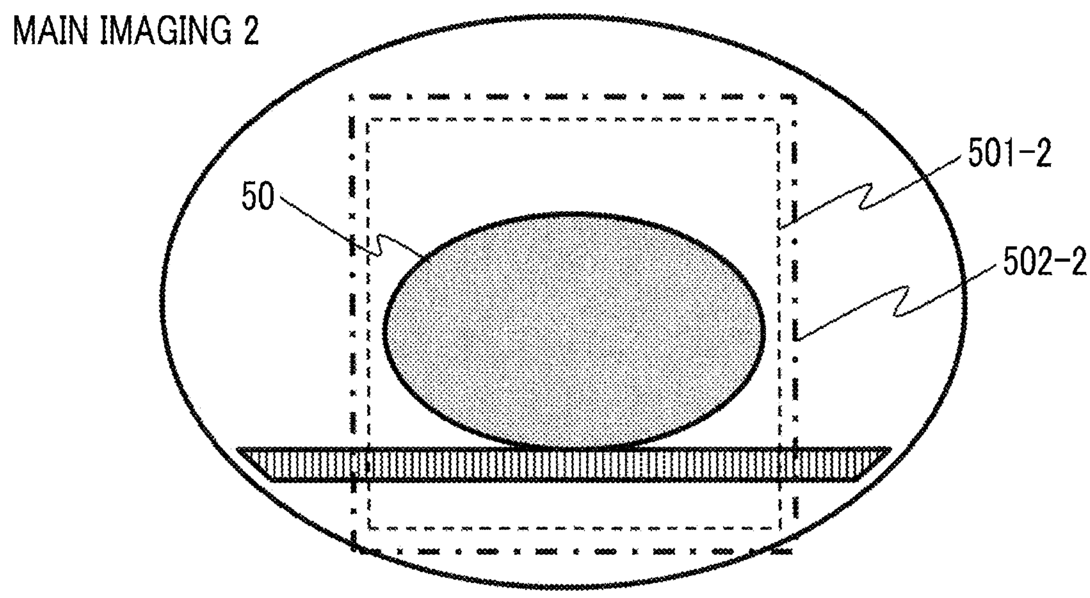

The upper and lower figures of FIG. 9 are diagrams illustrating imaging ranges 501-1 and 501-2 of two times of main imaging having different imaging ranges. As illustrated, the main imaging 1 has a smaller imaging range than the main imaging 2, and a positional relationship between the center of the imaging range and the center of the magnetic field is also different. In a case in which calibration ranges 502-1 and 502-2 are determined based on the imaging ranges, the ranges are different between the main imaging 1 and the main imaging 2.

In the present embodiment, the calibration range that can be applied to both the imaging ranges 501-1 and 501-2 of the two times of main imaging, and the subject position is determined. Specifically, as illustrated in FIG. 10, a calibration range 502-3 is determined to a range obtained by excluding the region other than the MR signal range from the sum of the calibration range 502-1 of the narrow side (in this example, the main imaging 1) and the calibration range 502-2 of the wide side (in this example, the main imaging 2).

By setting the calibration range as described above, the data obtained by one calibration imaging can be used for the main imaging 1 and the main imaging 2. The examination flow according to the present embodiment is obtained by omitting step S8 from the flow of FIG. 2, so that the re-execution of the calibration is not required, and the examination time can be reduced.

Figure 10:
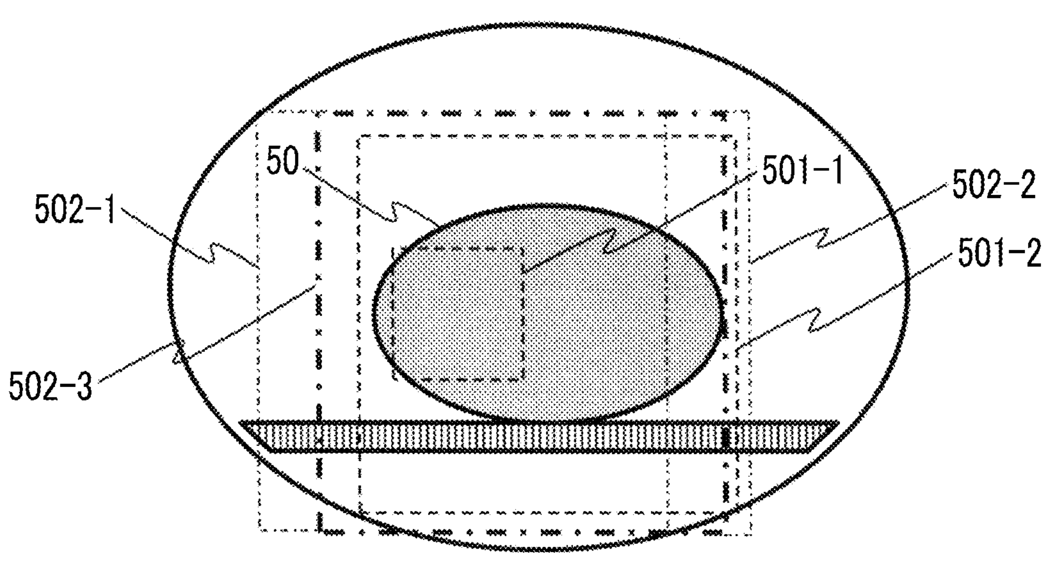
FIG. 10 is a diagram illustrating the setting of the calibration range according to Embodiment 2.

It should be noted that, although FIGS. 9 and 10 are examples in which the calibration range is set by using the information on a plurality of main imaging ranges and the subject position, as in the modification example of Embodiment 1, the spatial information other than the subject position, for example, the uniform magnetic field region or the spatial information outside the MR signal range may be taken into consideration, and the same effect can be obtained.

Embodiment 3

In Embodiment 1, the calibration range is set with reference to the position of the subject, particularly, the position of the subject disposed to deviate from the static magnetic field center, but in the present embodiment, the calibration range is set by using the spatial information on the appearance of the subject in a case in which the set main imaging range is set in an inappropriate range with respect to the subject.

The main imaging range is set in a range including the set examination part, but in a case in which, for example, the user mistakenly sets a "wrist joint" instead of a "shoulder joint", the main imaging range is a small range centered on the wrist, and in a case in which the calibration range is automatically set based on the small range, the calibration range is inappropriate. For example, as illustrated on the upper side of FIG. 11, a calibration range 501A is set inside the subject region instead of the original main imaging range 501. Such an inappropriate calibration range 502 may be also set in a case in which the physique of the subject is unexpectedly large.

In the present embodiment, the information on the region in which the subject exists is incorporated, and the calibration range 506 is set to cover the region of the subject.

Figure 11:
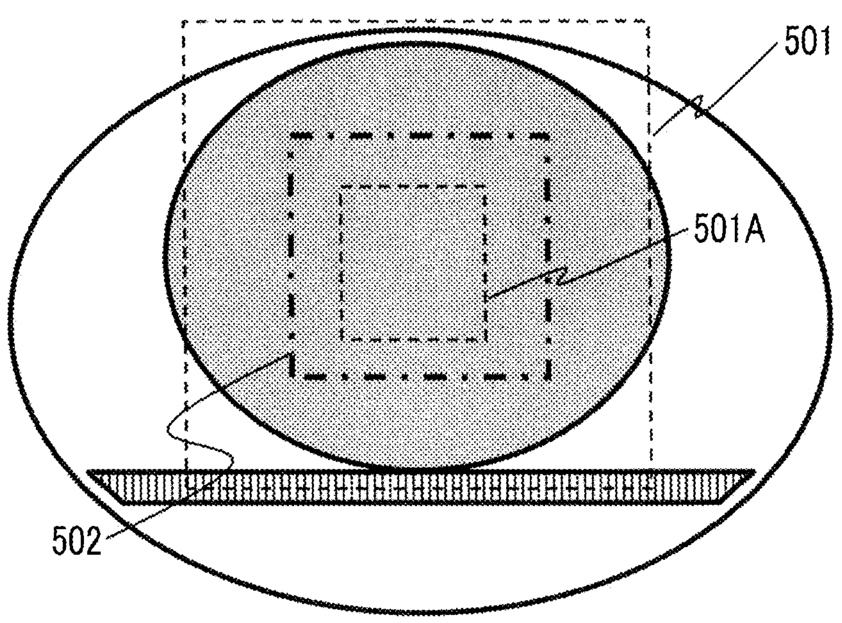
FIG. 11 is a diagram illustrating a setting of a calibration range according to Embodiment 3.
Figure 11:
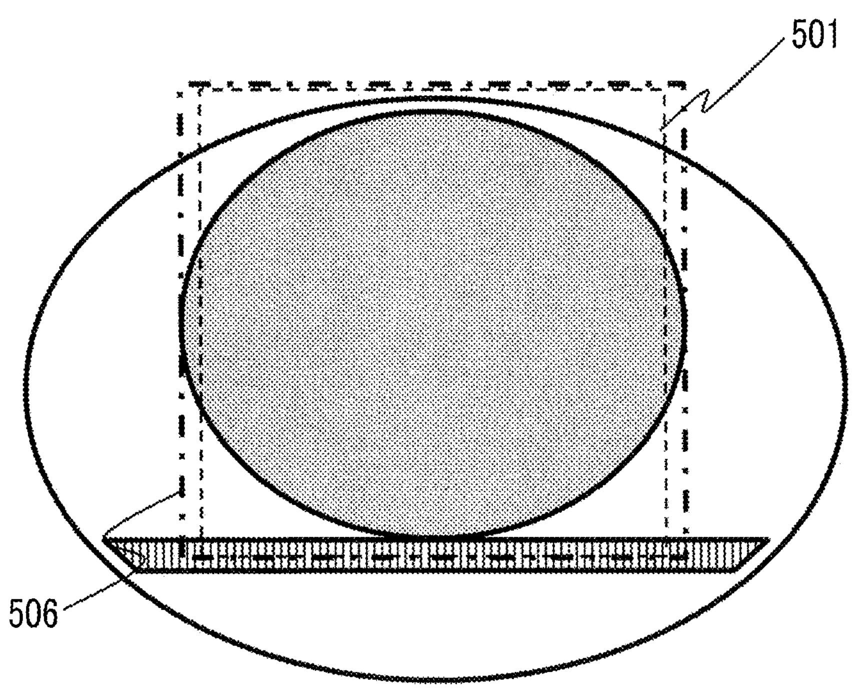

Although FIG. 11 illustrates an example in which the originally required calibration range cannot be covered only from the main imaging range, even in a case in which the subject is smaller than the expected size and the signal fill rate of the calibration range is significantly reduced, the spatial information on the subject is incorporated, the calibration range is set such that the subject is covered and the signal fill rate is increased.

According to the present embodiment, it is possible to prevent a case in which the calibration range determined from the main imaging range is inappropriate in relation to the subject and the required calibration data cannot be obtained, or a case in which the calibration imaging time from being lengthened due to the calibration data that is not actually required, and to set an appropriate calibration range.

Embodiment 4

In Embodiments 1 to 3 and the modification examples thereof, a case has been described in which the apparatus side automatically reads the spatial information and sets an appropriate calibration range, but the present embodiment is an embodiment in which the user adjustment via the UI unit 30 is enabled.

Figure 12:
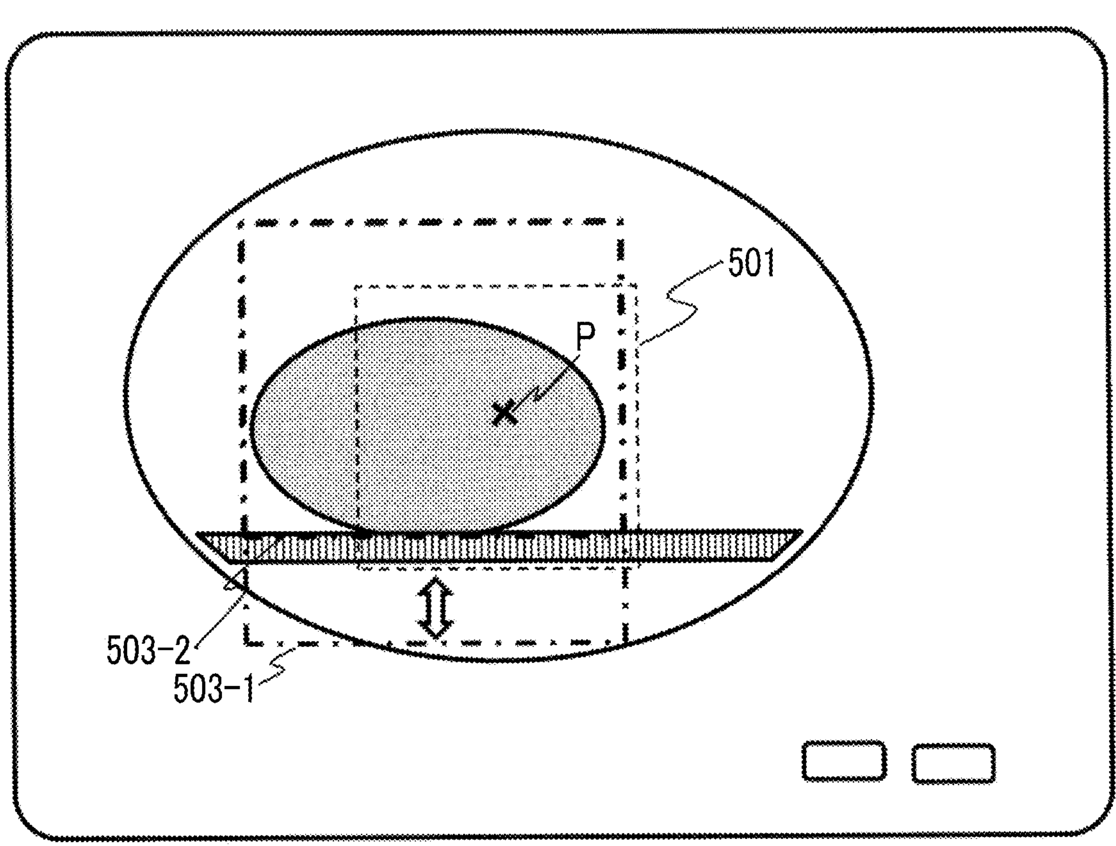
FIG. 12 is a diagram illustrating a setting of a calibration range according to Embodiment 4.

The user adjustment is realized by the display controller 230 presenting the set calibration range on the display device 31 of the UI unit 30 and receiving the adjustment by the user. The method of displaying on the display device is not particularly limited, but the calibration range 503 set by the calibration range setting unit 223 is displayed on the pre-measurement image of the subject by using a line diagram or the like. In this case, as illustrated in FIG. 12, the display may be performed together with the examination part P or the entire main imaging range 501. The line diagram illustrating the calibration range constitutes a GUI that can be moved, enlarged, and reduced by a mouse operation of the input device or the like, and receives the change by the user. The image may be a three-dimensional image or may be an image of three cross sections.

The user can confirm the presented calibration range, and can perform the adjustment, such as excluding the region outside the MR signal range (Example of FIG. 12: adjustment from 503-1 to 503-2), and expanding the range by determining whether or not data in a wide range is required even in a case in which it takes some time. In addition, in a case in which the plurality of times of main imaging having different ranges or parts are performed, the range of the calibration performed before each main imaging may be presented, and a button (GUI) for receiving the necessity of the re-execution of the calibration may be presented.

According to the present embodiment, by providing the user with the adjustment means, the degree of freedom of the user can be increased, and the user can be aware of the error such as the designation of the inappropriate examination part as described in Embodiment 3 before the main imaging.

Although each of the embodiments and modification examples of the present invention has been described above, the embodiments and the modification examples can be appropriately combined as long as the embodiments and the modification examples are not technically contradictory, and the combination is also included in the present invention.

EXPLANATION OF REFERENCES

1: MRI apparatus
10: imaging unit
20: controller
30: UI unit
40: external storage device
50: subject
210: imaging controller
220: imaging condition setting unit
221: main imaging range setting unit
223: calibration range setting unit
230: display controller

What is claimed is:

1. A magnetic resonance imaging apparatus comprising:
an imaging unit that performs main imaging of collecting a nuclear magnetic resonance signal, which is generated from a subject placed in a static magnetic field space, to acquire an image of the subject, and calibration imaging of collecting calibration data required for the main imaging; and
a controller that controls an operation of the imaging unit,
wherein the controller includes a calibration range setting unit that sets a range of the calibration imaging, and the calibration range setting unit sets a calibration range by using a main imaging range set in advance and spatial information other than the main imaging range, the spatial information used when setting the calibration range including a subject region and a uniform magnetic field region.

2. The magnetic resonance imaging apparatus according to claim 1,
wherein the calibration range setting unit uses any one or more of a static magnetic field uniform range, a gradient magnetic field range, a transmission and reception sensitivity range, gantry spatial information, or a subject range as the spatial information other than the main imaging range.

3. The magnetic resonance imaging apparatus according to claim 2,
wherein the calibration range setting unit sets the calibration range by excluding a portion of the main imaging range that does not overlap the subject range, in a case in which a center of the main imaging range and a center of the subject range deviate from each other.

4. The magnetic resonance imaging apparatus according to claim 1,
wherein the calibration range setting unit estimates a signal generation range in which the nuclear magnetic resonance signal is generated, by using the spatial information other than the main imaging range, and sets the calibration range by using the signal generation range.

5. The magnetic resonance imaging apparatus according to claim 4,
wherein the spatial information other than the main imaging range includes at least one of a subject range, a static magnetic field uniform range, a gradient magnetic field range, a transmission and reception sensitivity range, or a gantry spatial information, and
the calibration range setting unit estimates the signal generation range by using the subject range and the other spatial information.

6. The magnetic resonance imaging apparatus according to claim 4,
wherein the calibration range setting unit sets the calibration range such that a signal fill rate, which is a proportion of the signal generation range occupying the calibration range, is maximized.

7. The magnetic resonance imaging apparatus according to claim 1,
wherein the imaging unit performs a plurality of times of main imaging by setting different main imaging ranges, and
the controller determines, after one main imaging, whether or not a calibration range of calibration imaging performed for the one main imaging is applicable to calibration imaging for next main imaging, and does not perform the calibration imaging for the next main imaging in a case in which the calibration range is applicable.

8. The magnetic resonance imaging apparatus according to claim 1, further comprising: a UI unit that displays the calibration range set by the calibration range setting unit and receives a change of the calibration range.

9. The magnetic resonance imaging apparatus according to claim 1, wherein a region that deviates from uniform magnetic field region is excluded from the calibration range.

10. A calibration method of collecting, before main imaging of acquiring an image of a subject, calibration data required for the main imaging, the calibration method comprising:

a step of setting a calibration range, in the step of setting the calibration range, the calibration range being set by combining a main imaging range set in advance and spatial information other than the main imaging range, the spatial information used when setting the calibration range including a subject region and a uniform magnetic field region.

11. The calibration method according to claim 10, further comprising:

a step of estimating a signal generation range in which a nuclear magnetic resonance signal is generated, by using the spatial information other than the main imaging range, wherein, in the step of setting the calibration range, the calibration range is set by using the signal generation range.

12. The calibration method according to claim 11, wherein, in the step of setting the calibration range, the calibration range is set such that a signal fill rate, which is a proportion of the signal generation range occupying the calibration range, is maximized.

13. The calibration method according to claim 10, wherein the spatial information other than the main imaging range includes any one of a static magnetic field uniform range, a gradient magnetic field range, a transmission and reception sensitivity range, a gantry spatial information, or a subject range.

14. The calibration method according to claim 13, wherein, in the step of setting the calibration range, the calibration range is set to include the subject range in a case in which a center of the main imaging range and a center of the subject range deviate from each other.

15. The calibration method according to claim 13, wherein the calibration range is set by excluding a portion of the subject range, which is not included in the static magnetic field uniform range, from the calibration range.

16. The calibration method according to claim 13, wherein, in the step of setting the calibration range, the calibration range is set by using the gantry spatial information and excluding a region in which a disposition of the subject is restricted, from the main imaging range.

17. The calibration method according to claim 13, wherein the main imaging includes a plurality of times of main imaging having different main imaging ranges, and the step of setting the calibration range includes a step of determining, in a case in which the calibration range is set for previous main imaging, whether or not to reuse the set calibration range.

18. A magnetic resonance imaging apparatus comprising:

an imaging unit that performs main imaging of collecting a nuclear magnetic resonance signal, which is generated from a subject placed in a static magnetic field space, to acquire an image of the subject, and calibration imaging of collecting calibration data required for the main imaging; and a controller that controls an operation of the imaging unit, wherein the controller includes a calibration range setting unit that sets a range of the calibration imaging, and the calibration range setting unit sets a calibration range by using a main imaging range set in advance and spatial information other than the main imaging range, the spatial information used when setting the calibration range including a subject region and a uniform magnetic field region, and wherein the calibration range setting unit uses the spatial information and information regarding the uniform magnetic field region to exclude the uniform magnetic field region when determining the calibration range.

* * * * *